US010096480B2

(12) United States Patent
Rotondaro et al.

(10) Patent No.: US 10,096,480 B2
(45) Date of Patent: Oct. 9, 2018

(54) METHOD AND APPARATUS FOR DYNAMIC CONTROL OF THE TEMPERATURE OF A WET ETCH PROCESS

(71) Applicant: Tokyo Electron Limited, Minato-ku, Tokyo (JP)

(72) Inventors: Antonio Luis Pacheco Rotondaro, Austin, TX (US); Wallace P. Printz, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/282,104

(22) Filed: Sep. 30, 2016

(65) Prior Publication Data
US 2017/0092550 A1    Mar. 30, 2017

Related U.S. Application Data

(60) Provisional application No. 62/235,330, filed on Sep. 30, 2015.

(51) Int. Cl.
*H01L 21/306* (2006.01)
*H01L 21/3213* (2006.01)
*H01L 21/311* (2006.01)
*H01L 21/67* (2006.01)
*H01L 21/66* (2006.01)

(52) U.S. Cl.
CPC .. *H01L 21/30604* (2013.01); *H01L 21/30608* (2013.01); *H01L 21/31111* (2013.01); *H01L 21/32134* (2013.01); *H01L 21/6708* (2013.01); *H01L 21/67253* (2013.01); *H01L 22/12* (2013.01); *H01L 22/20* (2013.01); *H01L 22/26* (2013.01)

(58) Field of Classification Search
CPC ............... H01L 21/30617; H01L 22/26; H01L 21/30604–21/30608; H01L 21/32134; H01L 21/67075–21/6708; H01L 21/67248; H01L 21/67253; H01L 21/67259–21/67265; H01L 21/67276; H01L 20/10–20/12; H01L 20/20; H01L 20/26; H01L 22/12; H01L 22/20; H01L 21/32111; H01L 21/31111
See application file for complete search history.

(56) References Cited

U.S. PATENT DOCUMENTS

| 3,715,249 | A | 2/1973 | Theodore et al. |
| 3,764,423 | A | 10/1973 | Hauser, Jr. et al. |
| 4,092,211 | A | 5/1978 | Morris |
| 4,203,956 | A | 5/1980 | Schroter et al. |
| 4,451,507 | A | 5/1984 | Beltz et al. |
| 4,923,564 | A | 5/1990 | Bilakanti et al. |
| 4,971,654 | A | 11/1990 | Schnegg et al. |
| 5,389,194 | A | 2/1995 | Rostoker et al. |
| 5,865,937 | A * | 2/1999 | Shan ............... H01J 37/32174 156/345.44 |
| 5,885,903 | A | 3/1999 | Torek et al. |
| 5,910,257 | A | 6/1999 | Fukuda et al. |
| 6,087,273 | A | 6/2000 | Torek et al. |
| 6,096,233 | A * | 8/2000 | Taniyama ............... H01L 22/26 216/92 |
| 6,132,522 | A | 10/2000 | Verhaverbeke et al. |
| 6,162,370 | A | 12/2000 | Hackett et al. |
| 6,239,033 | B1 | 5/2001 | Kawai |
| 6,383,331 | B1 * | 5/2002 | Sumnitsch ............... B05C 11/08 156/345.1 |
| 6,453,914 | B2 | 9/2002 | Torek et al. |
| 6,468,902 | B2 | 10/2002 | Kawai |
| 6,576,547 | B2 | 6/2003 | Li |
| 6,664,611 | B2 | 12/2003 | Chen et al. |
| 7,235,188 | B2 | 6/2007 | Daviot et al. |
| 7,252,778 | B2 * | 8/2007 | Iwamoto ............ H01L 21/31111 216/84 |
| 7,338,910 | B2 | 3/2008 | Lee et al. |
| 7,592,264 | B2 | 9/2009 | Christenson et al. |
| 7,625,826 | B2 | 12/2009 | Rink et al. |
| 7,819,984 | B2 | 10/2010 | DeKraker et al. |
| 7,896,970 | B2 | 3/2011 | Tomita et al. |
| 7,906,438 | B2 * | 3/2011 | Koyata ............. H01L 21/02019 438/745 |
| 7,976,718 | B2 | 7/2011 | Kashkoush et al. |
| 8,466,071 | B2 * | 6/2013 | Koyata ............. H01L 21/02019 216/83 |
| 9,831,107 | B2 * | 11/2017 | Siefering ......... H01L 21/67075 |
| 9,899,229 | B2 * | 2/2018 | Hinode ............ H01L 21/31111 |

(Continued)

FOREIGN PATENT DOCUMENTS

KR 10-2015-0107773 A 9/2015
KR 10-2015-0108143 A 9/2015

OTHER PUBLICATIONS

Korean Intellectual Property Office, International Search Report and Written Opinion for International Application No. PCT/US2016/054805, dated Jan. 18, 2017, 11 pages.
Taiwan Intellectual Property Office, English translation of Notice of Examination Opinion issued in corresponding TW Application No. 105131249 dated Sep. 5, 2017, 10 pp.
The International Bureau of WIPO, International Preliminary Report on Patentability issued in counterpart Application PCT/US2016/054805 dated Apr. 3, 2018, 7 pp.
International Searching Authority, International Search Report and Written Opinion issued in counterpart International Application PCT/US2016/054805 dated Jan. 18, 2017, 11 pp.

*Primary Examiner* — Marvin Payen
*Assistant Examiner* — Jeremy Joy
(74) *Attorney, Agent, or Firm* — Wood Herron & Evans LLP

(57) ABSTRACT

A method for controlling the temperature profile of phosphoric acid process over a wafer surface through the dynamic control of radial dispensing of sulfuric acid at a selected temperature, which includes providing a substrate with a layer formed thereupon; dispensing a first chemical and second chemicals onto the layer while adjusting at least one parameter of the second chemical dispense to vary the etch rate across a region of the substrate.

22 Claims, No Drawings

(56) References Cited

U.S. PATENT DOCUMENTS

| | | | |
|---|---|---|---|
| 2001/0026950 A1* | 10/2001 | Sunakawa | H01L 21/0242 438/47 |
| 2002/0009894 A1* | 1/2002 | Chino | H01S 5/227 438/712 |
| 2003/0090671 A1* | 5/2003 | Takahashi | G01B 11/06 356/479 |
| 2003/0121889 A1* | 7/2003 | Takahashi | G01B 11/0675 216/84 |
| 2004/0261817 A1* | 12/2004 | Araki | H01L 21/67051 134/2 |
| 2005/0006341 A1* | 1/2005 | Frum | H01J 37/32935 216/59 |
| 2005/0019498 A1* | 1/2005 | Osawa | H01L 21/311 427/331 |
| 2005/0090093 A1* | 4/2005 | Bailey, III | H01J 37/32522 438/633 |
| 2005/0245041 A1* | 11/2005 | Frohberg | H01L 21/31116 438/424 |
| 2006/0191637 A1* | 8/2006 | Zajac | B81C 1/00547 156/345.34 |
| 2007/0087456 A1* | 4/2007 | Hashizume | H01L 21/67051 438/6 |
| 2007/0207622 A1 | 9/2007 | Rana et al. | |
| 2007/0257011 A1* | 11/2007 | Siefering | H01L 21/67086 216/83 |
| 2008/0035609 A1* | 2/2008 | Kashkoush | H01L 21/31111 216/84 |
| 2008/0064026 A1* | 3/2008 | Wu | A61K 31/553 435/5 |
| 2008/0064126 A1* | 3/2008 | Gaff | G01K 11/20 438/14 |
| 2008/0283090 A1 | 11/2008 | DeKraker et al. | |
| 2009/0065478 A1* | 3/2009 | Dockery | G01B 11/0675 216/60 |
| 2009/0227047 A1* | 9/2009 | Yang | H01L 21/30604 438/8 |
| 2010/0015805 A1* | 1/2010 | Mayer | C23F 1/02 438/692 |
| 2012/0074102 A1* | 3/2012 | Magara | C11D 7/08 216/83 |
| 2012/0145672 A1* | 6/2012 | Ratkovich | H01L 21/31111 216/83 |
| 2012/0247505 A1 | 10/2012 | Brown et al. | |
| 2012/0248061 A1 | 10/2012 | Brown et al. | |
| 2012/0289056 A1* | 11/2012 | Bergman | C09K 13/04 438/757 |
| 2013/0034966 A1* | 2/2013 | Yeh | H01L 21/31111 438/704 |
| 2013/0078809 A1* | 3/2013 | Yu | H01L 21/31111 438/689 |
| 2013/0203262 A1* | 8/2013 | Butterbaugh | H01L 21/31111 438/748 |
| 2013/0224956 A1* | 8/2013 | Negoro | H01L 21/31111 438/697 |
| 2013/0267099 A1* | 10/2013 | Yu | H01L 21/6708 438/748 |
| 2014/0007902 A1 | 1/2014 | Brown | |
| 2014/0030425 A1* | 1/2014 | Owei | H05K 3/383 427/97.1 |
| 2014/0061158 A1 | 3/2014 | Mayer et al. | |
| 2014/0144463 A1 | 5/2014 | Brown et al. | |
| 2015/0162211 A1* | 6/2015 | Siefering | H01L 21/31111 438/749 |
| 2016/0049281 A1* | 2/2016 | Berry, III | H01J 37/36 156/345.26 |
| 2017/0148930 A1* | 5/2017 | Zhu | H01L 31/02363 |

\* cited by examiner

METHOD AND APPARATUS FOR DYNAMIC CONTROL OF THE TEMPERATURE OF A WET ETCH PROCESS

This application claims priority to U.S. provisional application Ser. No. 62/235,330, filed Sep. 30, 2015, incorporated by reference in its entirety.

TECHNICAL FIELD OF THE INVENTION

This invention relates to wet etch treatment of semiconductor surfaces in mixtures of phosphoric acid and sulfuric acid by controlling the temperature profile of the acid over a semiconductor wafer surface through dynamic control of radial dispensing of sulfuric acid.

BACKGROUND

The wet treatment of the semiconductor surface aims for film removal, substrate etching, substrate wet doping, surface polishing, contamination removal, surface conditioning and combination of thereof. Phosphoric acid etching is a well-established process (e.g., treating wafers on wet benches). Known processes employ stable operating conditions such as acid boiling points. These processes provide good selectivity of nitride to oxide (35:1 at 165 Centigrade), which can be improved by using in addition to phosphoric acid, sulfuric acid and/or water. Use of sulfuric acid can improve the selectivity to etch nitride to oxide, while the use of water increases the silicon nitride etch rate. However, long over-etch times are sometimes needed to guarantee complete film removal, resulting in reduced throughput and high selectivity to other materials is required due to overetch. Improvements to wet etching of semiconductor surfaces are highly sought.

SUMMARY OF THE INVENTION

This invention provides a solution to one or more of the disadvantages and/or omissions discussed above.

More specifically, this invention provides a novel method for controlling the temperature profile of phosphoric acid process over a wafer surface through the dynamic control of radial dispensing of sulfuric acid at a selected temperature and the apparatus for implementing the proposed method.

This invention seeks to solve the problem of localized and independent control of phosphoric acid concentration and temperature at the semiconductor surface. The desire is to provide a significant control of acid temperature profile across the semiconductor surface. This is important because the temperature profile of each wafer can vary such that the acid temperature has a direct correlation to film etch rate and residue removal efficiency.

This invention provides the capability of controlling the acid temperature profile on the semiconductor surface. Thus, the profile can be made to be flat, edge high, edge low, etc., so that the etch rate is locally adjusted to meet the process needs.

The etch rate profile is selected to meet process needs such as to compensate for a deposition process that is for example thicker at the edge. In this case the temperature profile is adjusted to be edge high resulting in higher removal at the edge achieving a total removal of the film to be stripped without the need of long over-etch process time.

Thus, for example, a film thickness profile determination is determined to remove thicker regions while not damaging the film under thinner regions.

In one broad respect, this invention is a method for etching a layer on a substrate, comprising: providing a substrate with a layer formed thereupon; dispensing a first chemical onto the layer; separately dispensing a second chemical onto the layer while dispensing a first chemical; adjusting at least one parameter of the second chemical dispense, during the second chemical dispensing, across a region of the substrate.

In contrast to known processes using phosphoric acid and sulfuric acid, the present invention dispenses independent streams of each acid on the semiconductor surface and the dispense location of sulfuric acid is controlled to achieve a desired temperature profile at desired positions on the surface.

The dynamic control of this invention is performed by co-dispensing sulfuric acid to significantly control the process temperature profile and consequently the etch rate profile is controlled by the variation of local temperature induced by the local sulfuric acid dispense. The sulfuric acid radius, temperature, flow and concentration are selected to achieve a desired temperature profile, with the dispense location chosen to achieve a cross wafer temperature profile. The temperature profile is dynamically customized for each wafer so that each etch rate profile is also customized. This results in the reduction of the overetch time and thus improved throughput. The term overetch has its ordinary meaning in the field of semiconductor processing.

DETAILED DESCRIPTION OF THE INVENTION

In general, the temperature profile is customized for each wafer, which results in a customized etch rate profile for each wafer. This permits the reduction of overetch time thereby improving throughput. Compared to traditional processing, the selectivity requirement is relaxed. Sulfuric acid dispense ratio, temperature, flow and concentration are selected to achieve desire temperature profiles for each wafer with dispense location chosen to achieve the desired etch profile across the wafer temperature profile. In this invention, sulfuric acid is co-dispensed with phosphoric acid at a chosen wafer radius to significantly control the process temperature profile.

Consequently, the etch rate profile is controlled by the variation of local temperature induced by the local sulfuric acid dispense. This invention permits the operator to produce a constant temperature or a variable temperature depending on the desired outcome based on the wafer profile.

In general, this invention is a method for etching a layer on a substrate. The method includes providing a substrate with a layer formed thereupon. In this invention, the substrate is a silicon wafer used in the production of semiconductors, as those terms are conventionally used. Next, a first chemical is dispensed onto the layer, while separately a second chemical is dispensed onto the layer while dispensing a first chemical.

During this process, at least one parameter is adjusted of the second chemical dispense, during the second chemical dispensing, across a region of the substrate. The parameters include but are not limited to sulfuric acid dispense radius: determined to achieve temperature profile; sulfuric acid dispense concentration is typically 96 percent by weight; sulfuric acid dispense temperature which is determined to achieve a desired temperature profile; sulfuric acid dispense flow which is determined to achieve a given temperature profile; a phosphoric acid dispense concentration which is typically 85 percent by weight; a phosphoric acid dispense temperature which is determined to achieve a given silicon nitride etch rate; phosphoric acid dispense flow which is determined to achieve a given silicon nitride to silicon oxide selectivity; water dispense temperature, which is typically 25 C; water dispense flow which is determined to achieve a given silicon nitride to silicon oxide selectivity. In addition, it is typically considered that the minimum silicon nitride etch rate is 1 nm/minute at a phosphoric acid temperature less than or equal to 140 C.

The first chemical dispensed onto the surface can be any chemical that facilitates etching of the surface, with such first chemicals typically being in liquid form and/or being an inorganic acid. In one embodiment, the first chemical comprises phosphoric acid ($H_3PO_4$). The first chemical is typically dispensed at a temperature of from 25 C to 300 C, more typically from 100 C to 250 C, and even more typically from 125 C to 250 C. In one embodiment, the first chemical is dispensed at 140 C. The second chemical can be any chemical which assists the first chemical in controlling the process temperature profile. Such second chemicals are typically in liquid form and/or are inorganic acids. In one embodiment, the second chemical comprises sulfuric acid ($H_2SO_4$). The second chemical is typically dispensed at a temperature of from 25 C to 300 C, more typically from 100 C to 250 C, and even more typically from 125 C to 250 C. In one embodiment, the first chemical is dispensed at a temperature of from 140 C to 220 C.

In one embodiment, the region of the substrate where dispensing occurs is the entire substrate. However, the dispense can also be localized depending on the desired outcome. With respect to the dispensing, the dispensing of the second chemical can start simultaneous with the step of dispensing the first chemical. In another embodiment, the step of dispensing the second chemical starts after the start of the step of dispensing the first chemical.

In certain embodiments, the first chemical is dispensed from a first nozzle and the second chemical is dispensed from a second nozzle. It should be noted that the first and second chemicals can be co-dispensed from the same nozzle, such as by independently controlling the flow of the second chemical inline at the point, for example, of the first and second chemicals first contact one another, thus permitting the second chemical to be co-dispersed at varying concentrations with the first chemical as the process moves forward in time and as the nozzle may move from region to region over the substrate surface. In this regard, the first nozzle can be mounted on a first dispense arm and the second nozzle can be mounted on a second dispense arm. It should be appreciated that the first and second dispense arms are rotatable about a pivot point, to reach all radial locations on the substrate.

In one embodiment, at least one parameter of the second dispense includes dispense location of the second chemical on the substrate, temperature of the second chemical, flowrate of the second chemical, and concentration of the second chemical. In another embodiment, adjusting at least one parameter of the second chemical dispense is performed to vary an etch rate of the layer across the region of the substrate to compensate for a thickness nonuniformity of the layer. In another embodiment, adjusting at least one parameter of the second chemical dispense is performed to minimize overetch across the region of the substrate. Alternatively, adjusting at least one parameter of the second chemical dispense may be performed to reach a layer etch endpoint substantially at the same time across the region of the substrate. In yet another alternative, adjusting at least one parameter of the second chemical dispense is performed to achieve a predetermined etch rate profile across the region of the substrate. In another embodiment, adjusting at least one parameter of the second chemical dispense is performed to achieve a predetermined temperature profile across the region of the substrate. In another embodiment, adjusting at least one parameter of the second chemical dispense is performed to achieve a predetermined selectivity profile across the region of the substrate. Also, adjusting at least one parameter of the second chemical dispense can be performed to reduce the etch rate as a layer etch endpoint is approached.

In one embodiment, the method of this invention includes adjusting at least one parameter of the first chemical dispense. In this regard, at least one parameter of the first dispense comprises dispense location of the first chemical on the substrate, temperature of the first chemical, flowrate of the first chemical, and concentration of the first chemical.

In another embodiment, the method of this invention includes dispensing water onto the layer. In this regard, the water can be dispensed from a third nozzle. The third nozzle can for example be mounted on a third dispense arm. In this embodiment, the water flowrate or water temperature, or both, are adjusted during the water dispense. Likewise, the adjustment of the water flowrate or the water temperature, or both, can be performed to select a desired etch selectivity.

In another embodiment, the method includes measuring the temperature of the substrate during etching. In this regard, the method utilizes the measured substrate temperature in a feedforward or feedback manner for adjustment of the at least one parameter of the second chemical dispense.

The process variables that are taken into account for the dynamic control of the temperature profile include but are not limited to: sulfuric acid dispense radius: determined to achieve temperature profile; sulfuric acid dispense concentration is typically 96 percent by weight; sulfuric acid dispense temperature which is determined to achieve a desired temperature profile; sulfuric acid dispense flow which is determined to achieve a given temperature profile; a phosphoric acid dispense concentration which is typically 85 percent by weight; a phosphoric acid dispense temperature which is determined to achieve a given silicon nitride etch rate; phosphoric acid dispense flow which is determined to achieve a given silicon nitride to silicon oxide selectivity; water dispense temperature, which is typically 10 C to 90 C, more typically from 20 C to 50 C, and in one embodiment is 25 C; water dispense flow which is determined to achieve a given silicon nitride to silicon oxide selectivity.

In addition, it is typically considered that the minimum silicon nitride etch rate is 1 nm/minute at a phosphoric acid temperature less than or equal to 140 C. In one embodiment, the phosphoric acid reference flow is 1 sLm (1 standard liter per minute).

Among these variables, the sulfuric acid is key for temperature control and uniformity. A flat temperature profile can be achieved for example at a dispensed sulfuric acid temperature of 220 C to achieve a flat etch, with temperatures above 220 C increasing the etch rate and with temperatures below 220 C such as at 140 C providing a decreased etch rate. It should be appreciated that sulfuric acid is an inert chemical component in the mixture for purposes of the silicon nitride etch. The water concentration in mixture with phosphoric acid is independent of the acid temperature. In the practice of this invention, adding water to a phosphoric acid/sulfuric acid mixture enables processing at high temperature with high relative water content, which itself improves the etch selectivity of silicon nitride relative to silicon oxide. Water dispense flow and temperature are selected to achieve the desired etch rate and selectivity.

The following table exemplifies operating points to illustrate the versatility of the process of this invention. In each case, phosphoric acid dispense concentration is 85 wt %, the phosphoric acid dispense temp is 140 C, the phosphoric acid dispense flow is 1 sLm, and the sulfuric acid dispense concentration is 96 wt %.

| H2SO4 dispensed temp (C.) | H2SO4 dispensed flow (sLm) | H2O dispensed temp (C.) | Max H2O flow (sLm) | Max temp (C.) | Max H2O conc (wt %) |
|---|---|---|---|---|---|
| 140 | 1 | NA | NA | 179.0 | 0.183 |
| 220 | 2 | NA | NA | 219.2 | 0.213 |
| 140 | 1 | 25 | 0.24 | 195.5 | 0.336 |
| 220 | 1 | 25 | 0.07 | 223.3 | 0.234 |
| 220 | 2 | 25 | 0.22 | 234.3 | 0.346 |

An exemplary process flow scheme of this invention is as follows: determine thickness profile of film to be removed; determine etch rate profile to compensate for film thickness profile; determine temperature profile to achieve desired etch rate profile; provide phosphoric acid at given temperature, concentration, and flow; dispense phosphoric acid to the wafer surface; provide sulfuric acid at a given temperature, concentration, and flow; and co-disperse the sulfuric acid at a location on the wafer surface to achieve the desired temperature profile.

Having two or more nozzles would allow dispensing the sulfuric acid at different radius on the wafer. This permits the operator to locally control the ratio of phosphoric acid to sulfuric acid to create the desired temperature profile. Alternatively, a nozzle for water dispense can be included. Likewise, a nozzle for a second sulfuric acid dispense can alternatively be included.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein, and certain features of the invention may be utilized independently of the use of other features, all as would be apparent to one skilled in the art after having the benefit of this description of the invention.

What is claimed is:

1. A method for etching a layer on a substrate, comprising:
providing the substrate with the layer formed thereupon;
dispensing a first chemical comprising phosphoric acid ($H_3PO_4$) onto the layer;
separately dispensing a second chemical comprising sulfuric acid ($H_2SO_4$) onto the layer while dispensing the first chemical to etch the layer with the first and second chemicals;
adjusting at least one parameter of the first chemical dispense, during the first chemical dispensing, and adjusting at least one parameter of the second chemical dispense, during the second chemical dispensing, to vary an etch rate across a region of the substrate as the layer is being etched; and
dispensing water onto the layer while dispensing the first and second chemicals, and adjusting a water flowrate or a water temperature, or both, during the water dispensing effective to achieve a desired etch selectivity.

2. The method of claim 1, wherein the region of the substrate includes the entire substrate.

3. The method of claim 1, wherein the step of dispensing the second chemical starts simultaneous with the step of dispensing the first chemical.

4. The method of claim 1, wherein the step of dispensing the second chemical starts after the start of the step of dispensing the first chemical.

5. The method of claim 1, wherein the first chemical is dispensed from a first nozzle and the second chemical is dispensed from a second nozzle.

6. The method of claim 5, wherein the first nozzle is mounted on a first dispense arm and the second nozzle is mounted on a second dispense arm.

7. The method of claim 6, wherein the first and second dispense arms are rotatable about a pivot point, to reach all radial locations on the substrate.

8. The method of claim 1, wherein the at least one parameter of the second chemical dispense comprises at least one of a dispense location of the second chemical on the substrate, a temperature of the second chemical, a flowrate of the second chemical, or a concentration of the second chemical.

9. The method of claim 1, wherein the adjusting of the at least one parameter of the first chemical dispense and the adjusting of the at least one parameter of the second chemical dispense are performed to vary an etch rate of the layer across the region of the substrate to compensate for a thickness nonuniformity of the layer.

10. The method of claim 1, wherein the adjusting of the at least one parameter of the first chemical dispense and the adjusting of the at least one parameter of the second chemical dispense are performed to minimize over-etch across the region of the substrate.

11. The method of claim 1, wherein the adjusting of the at least one parameter of the first chemical dispense and the adjusting of the at least one parameter of the second chemical dispense are performed to reach a layer etch endpoint substantially at the same time across the region of the substrate.

12. The method of claim 1, wherein the adjusting of the at least one parameter of the first chemical dispense and the adjusting of the at least one parameter of the second chemical dispense are performed to achieve a predetermined etch rate profile across the region of the substrate.

13. The method of claim 1, wherein the adjusting of the at least one parameter of the first chemical dispense and the adjusting of the at least one parameter of the second chemical dispense are performed to achieve a predetermined temperature profile across the region of the substrate.

14. The method of claim 1 wherein the adjusting of the at least one parameter of the first chemical dispense, the adjusting of the at least one parameter of the second chemical dispense and the adjusting the water flowrate or the water temperature, or both, are performed to achieve a predetermined selectivity profile across the region of the substrate.

15. The method of claim 1, wherein the at least one parameter of the first chemical dispense comprises at least one of a dispense location of the first chemical on the substrate, a temperature of the first chemical, a flowrate of the first chemical, or a concentration of the first chemical.

16. The method of claim 1, further comprising:
measuring a temperature of the substrate during etching.

17. The method of claim 1, wherein the adjusting the at least one parameter of the second chemical dispense is performed to reduce the etch rate as a layer etch endpoint is approached.

18. A method for etching a layer on a substrate, comprising:
determining a thickness profile of the layer on the substrate;
determining an etch rate profile to compensate for nonuniformity in the thickness profile;
dispensing a first chemical onto the layer;
separately dispensing a second chemical onto the layer while dispensing the first chemical to etch the layer with the first and second chemicals; and
as the layer is being etched, adjusting at least one parameter of the second chemical dispense, during the second chemical dispensing, to produce a first etch rate on a first region of the substrate that differs from a second etch rate at a second region of the substrate according to the etch rate profile.

19. The method of claim 18, further comprising:
determining a nonuniform temperature profile of the first chemical mixed with the second chemical on the layer, the nonuniform temperature profile being based on the nonuniformity in the thickness profile.

20. The method of claim 19, wherein the layer is thicker in the first region of the substrate than the layer in the second region of the substrate, and determining the nonuniform temperature profile includes adjusting the temperature profile to result in a higher removal rate at the first region compared to the second region.

21. The method of claim 18, wherein adjusting includes codispensing the second chemical at a selected radius of the substrate to increase or decrease the etch rate at the selected radius corresponding to a thicker region or a thinner region of the thickness profile, respectively.

22. The method of claim 18, wherein the adjusting the at least one parameter of the second chemical dispense includes reducing the first and/or second etch rate as a layer etch endpoint is approached.

* * * * *